(12) United States Patent
Chang et al.

(10) Patent No.: US 7,179,714 B2
(45) Date of Patent: Feb. 20, 2007

(54) METHOD OF FABRICATING MOS TRANSISTOR HAVING FULLY SILICIDED GATE

(75) Inventors: You-Jean Chang, Suwon-si (KR); Myoung-Hwan Oh, Yongin-si (KR); Hee-Sung Kang, Seongnam-si (KR); Choong-Ryul Ryou, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/065,242

(22) Filed: Feb. 24, 2005

(65) Prior Publication Data

US 2005/0191833 A1    Sep. 1, 2005

(30) Foreign Application Priority Data

Feb. 27, 2004   (KR) .................... 10-2004-0013687

(51) Int. Cl.
*H01L 21/336* (2006.01)
(52) U.S. Cl. .................. 438/303; 438/299; 438/233; 438/243; 438/291; 438/303; 438/529; 438/592; 438/626; 438/682; 257/E21.199; 257/E21.426; 257/E21.443; 257/E21.444; 257/E21.636
(58) Field of Classification Search ............... 438/233, 438/291, 529
See application file for complete search history.

(56) References Cited

U.S. PATENT DOCUMENTS 5,981,365 A * 11/1999 Cheek et al. ............... 438/592
5,994,193 A * 11/1999 Gardner et al. ............ 438/303
6,080,648 A *  6/2000 Nagashima ................. 438/592
6,096,642 A    8/2000 Wu ............................ 438/655

FOREIGN PATENT DOCUMENTS

JP         11-284179        10/1999
KR         01-26811          4/2001

OTHER PUBLICATIONS

"Totally Silicided (CoSi$_2$)Polysilicon: a novel approach to very low-resistive gate(~2Ω/□)without metal CMP nor etching," B. Tavel, et al., 2001 IEEE.

* cited by examiner

*Primary Examiner*—Michael Lebentritt
*Assistant Examiner*—Kyoung Lee
(74) *Attorney, Agent, or Firm*—Mills & Onello LLP

(57) ABSTRACT

There is provided a method of fabricating a MOS transistor having a fully silicided gate, including forming a gate pattern and gate spacers on a semiconductor substrate, the gate pattern including a lower gate pattern, an insulating layer pattern, and an upper gate pattern, which are sequentially stacked. Source/drain regions are formed by implanting impurity ions into an active region using the gate pattern and the gate spacers as ion implantation masks. Then, a protecting layer is formed on the semiconductor substrate having the gate pattern, and the protecting layer is planarized until the upper gate pattern is exposed. Then, by removing the exposed upper gate pattern and the insulating layer pattern, the lower gate pattern is exposed. Then, the protecting layer is selectively removed, thereby exposing the source/drain regions. The exposed lower gate pattern is fully converted to a gate silicide layer, and a silicide layer is concurrently formed on the surfaces of the source/drain regions.

19 Claims, 12 Drawing Sheets

METHOD OF FABRICATING MOS TRANSISTOR HAVING FULLY SILICIDED GATE

CROSS-REFERENCE TO RELATED APPLICATION

This application claims priority from Korean Patent Application No. 2004-13687, filed on Feb. 27, 2004, the disclosure of which is hereby incorporated herein by reference in its entirety as if set forth fully herein.

BACKGROUND OF INVENTION

1. Technical Field

The present invention relates to a method of fabricating a semiconductor device, and more particularly, to a method of fabricating a MOS transistor having a fully silicided gate.

2. Discussion of the Related Art

Semiconductor devices widely employ discrete devices such as MOS transistors as switching devices. With the increase in the integration of the MOS transistor, the MOS transistor has been scaled down in size. As a result, the length of the channel in the MOS transistor is reduced, thereby causing a short channel effect.

To reduce the effects of the short channel effect, it is required that the junction depth of the source/drain regions in the MOS transistor be reduced. However, the reduction of the junction depth of the source/drain regions causes an increase in the area resistance of the source/drain regions. Thus, the device fails to provide a drive current sufficient to drive a high performance transistor. Therefore, a self-aligned silicide process has been proposed to reduce the area resistance of a gate electrode as well as reduce the area resistance of the source/drain regions.

The self-aligned silicide process is widely used to form a silicide layer on the source/drain regions and the gate region concurrently. In general, the thickness of the silicide layer formed on the source/drain regions must be smaller than the junction depth.

Also, with the scale-down of the MOS transistor, the thickness of a gate insulating layer has been significantly reduced to prevent the short channel effect and improve the drive current capability. The thickness reduction of the gate insulating layer increases a capacitance of the gate insulating layer and improves a drive current capability.

However, when the thickness of the gate insulating layer is reduced, polysilicon depletion may occur in the MOS transistor that uses a polysilicon layer as a gate electrode. A polysilicon depletion layer increases an electrical equivalent thickness of a gate insulating layer, and reduces drive current.

Therefore, use of a metal gate is widely studied in order to solve the polysilicon depletion. However, the metal gate has a drawback in that controlling a threshold voltage Vth of a transistor becomes difficult with a metal gate. Specifically, respective threshold voltages of an N-MOS transistor and a P-MOS transistor must be controlled to use a metal gate in a CMOS transistor. The use of different metal gates in the respective MOS transistors make fabrication processes complicated and, therefore, difficult to employ.

A method of solving the problems of the polysilicon depletion and the metal gate has been disclosed in the report entitled "Totally Silicided ($CoSi_2$) Polysilicon; a novel approach to very low-resistive gate without metal CMP nor etching"; IEDM 2001, p. 825~828, December of 2001, by Tavel, et. al.

However, the method proposed by this report has drawbacks in that a threshold voltage Vth is increased due to a reduction of the absolute value of a flat band voltage Vfb because a midgap material is used for a metal gate.

In order to form a silicide layer of source/drain regions and a gate silicide layer using a fully silicided gate process, it is necessary to reduce the gate height. However, if the gate height is reduced, ions are implanted into a channel region during an ion implantation process for the source/drain regions, so that leakage current of the MOS transistor may increase.

SUMMARY OF THE INVENTION

Therefore, the present invention provides a method of fabricating a MOS transistor employing a fully silicided gate process by which a silicide layer of source/drain regions and a gate silicide layer are formed, thereby preventing impurity ions from being injected into a channel region during the source/drain ion implantation process.

In accordance with an exemplary embodiment, the present invention provides a method of fabricating a MOS transistor having a fully silicided gate. The method includes forming a gate pattern and gate spacers on a semiconductor substrate, the gate pattern including a lower gate pattern, an insulating layer pattern, and an upper gate pattern, which are sequentially stacked. Source/drain regions are formed by implanting impurity ions into an active region using the gate pattern and the gate spacers as ion implantation masks. A protecting layer is formed on the semiconductor substrate having the gate pattern, and the protecting layer is planarized until the upper gate pattern is exposed. Then, by removing the exposed upper gate pattern and the insulating layer pattern, the lower gate pattern is exposed. The protecting layer is selectively removed, thereby exposing the source/drain regions. The exposed lower gate pattern is fully converted to a gate silicide layer, and silicide layer is concurrently formed on the surfaces of the source/drain regions.

The step of forming the gate pattern and the gate spacers may include forming a device isolation layer in a predetermined area of the semiconductor substrate so as to isolate the active region. A gate layer is formed on the semiconductor substrate, the gate layer including a lower gate layer, an insulating layer, and an upper gate layer, which are sequentially stacked. The upper gate layer, the insulating layer, and the lower gate layer are sequentially patterned, thereby forming a pattern running over the active region. Spacers are formed on sidewalls of the gate pattern.

Before forming the gate pattern, a doped gate layer may be formed by implanting impurity ions into the gate layer.

The step of removing the upper gate pattern and the insulating layer pattern may include planarizing the upper gate pattern until the insulating layer pattern is exposed. The insulating layer pattern may be etched using a wet or dry etch technology.

Alternatively, the step of removing the upper gate pattern and the insulating layer pattern may include etching the upper gate pattern using a wet or dry etch technology. The insulating layer pattern may also be etched using a wet or dry etch technology.

The step of fully converting the exposed lower gate pattern to a gate silicide layer and concurrently forming a silicide layer on the surfaces of the source/drain regions may include forming a metal layer on the semiconductor substrate having the exposed lower gate pattern. The metal layer is annealed until the exposed lower gate pattern is totally silicided. An unreacted portion of the metal layer on the gate spacers and the device isolation layer is removed.

The metal layer may be composed of nickel, cobalt, tungsten, tantalum, or titanium, or an alloy layer composed of at least two of those metals.

The semiconductor substrate may be a single crystal silicon substrate, a silicon-on insulator (SOI) substrate, or a strained silicon substrate.

The upper and lower gate patterns may be formed of silicon or germanium silicon using a low pressure chemical vapor deposition (LPCVD), rapid thermal CVD (RTCVD), or plasma enhanced CVD (PECVD) technology.

The insulating layer pattern may be formed of one single layer selected from a silicon oxide layer, a silicon nitride layer, and a silicon oxynitride layer, or a multi-layer composed of at least two of those layers.

The protecting layer may be formed of one single layer selected from a silicon oxide layer, a silicon nitride layer, and a silicon oxynitride layer, or a multi-layer composed of at least two of those layers.

The method may further include forming at least one second insulating layer pattern and at least one second upper gate pattern on the upper gate pattern.

The gate spacers may be formed of one single-layered wall selected from a silicon oxide layer, or a silicon nitride layer, or multi-layered wall composed of at least two of those layers.

The protecting layer can be formed of a material layer having an etch selectivity with respect to the gate spacers.

In another aspect of the present invention, the present invention provides a method of fabricating a MOS transistor having a fully silicided gate. The method includes forming a gate pattern and gate spacers on a semiconductor substrate, the gate pattern including a lower gate pattern, an insulating layer pattern, and an upper gate pattern, which are sequentially stacked. Source/drain regions are formed by implanting impurity ions into an active region using the gate pattern and the gate spacers as ion implantation masks. A silicide layer is formed on a surface of the upper gate pattern and surfaces of the source/drain regions, thereby forming an upper gate silicide layer and a source/drain silicide layer. A protecting layer is formed on the semiconductor substrate having the upper gate silicide layer. The protecting layer is planarized until a surface of the upper gate silicide layer is exposed. The upper gate silicide layer is removed. The upper gate pattern and the insulating layer pattern are removed, thereby exposing the lower gate pattern. The exposed lower gate pattern is fully converted to a silicide layer.

The step of forming the gate pattern and the gate spacers may include forming a device isolation layer in a predetermined area of the semiconductor substrate so as to isolate the active region. A gate layer is formed on the semiconductor substrate, the gate layer including a lower gate layer, an insulating layer, and an upper gate layer, which are sequentially stacked. The upper gate layer, the insulating layer, and the lower gate layer are sequentially patterned, thereby forming a pattern running over the active region. Spacers are formed on sidewalls of the gate pattern.

Before forming the gate pattern, a doped gate layer may be formed by implanting impurity ions into the gate layer.

The step of removing the upper gate pattern and the insulating layer pattern may be performed by planarizing the upper gate pattern until the insulating layer pattern is exposed. The insulating layer pattern may be etched using a wet or dry etch technology.

Alternatively, the step of removing the upper gate pattern and the insulating layer pattern may be performed by etching the upper gate pattern using a wet or dry etch technology. The insulating layer pattern may be etched using a wet or dry etch technology.

Preferably, the protecting layer is formed of a material layer having an etch selectivity with respect to the gate spacers.

The semiconductor substrate may be a single crystal silicon substrate, a silicon-on insulator (SOI) substrate, or a strained silicon substrate.

The upper and lower gate patterns may be formed of silicon or germanium silicon using an LPCVD, RTCVD, or PECVD technology.

The insulating layer pattern may be formed of one single layer selected from a silicon oxide layer, a silicon nitride layer, or a silicon oxynitride layer, or a multi-layer composed of at least two layers thereof.

The protecting layer may be formed of one single layer selected from a silicon oxide layer, a silicon nitride layer, or a silicon oxynitride layer, or a multi-layer composed of at least two layers thereof.

The method may further include forming at least one second insulating layer pattern and at least one second upper gate pattern on the upper gate pattern.

The gate spacers may be formed of one single-layered wall selected from a silicon oxide layer, or a silicon nitride layer, or multi-layered wall composed of at least two layers thereof.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thicknesses of layers are exaggerated for clarity. It will be understood that when a layer is referred to as being "on" another layer or substrate, it can be directly on the other layer or substrate, or intervening layers may also be present.

DETAILED DESCRIPTION OF THE INVENTION

Figure 1A:
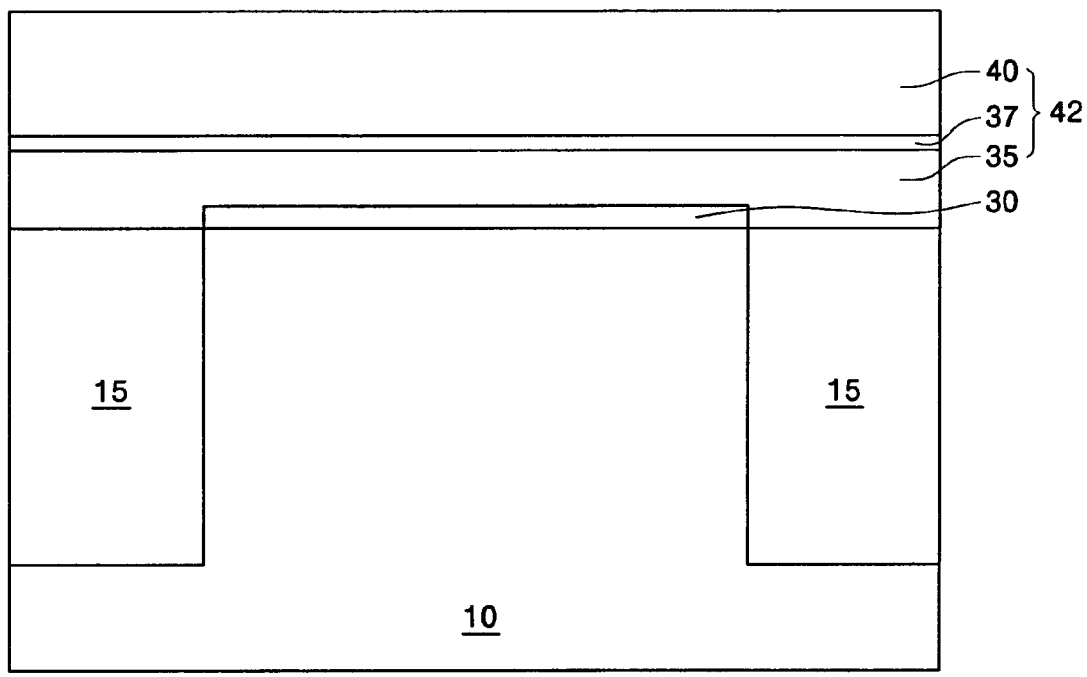
FIGS. 1A to 1C are sectional views illustrating steps of a method of fabricating a MOS transistor, up to formation of source/drain regions, according to embodiments of the present invention.
Figure 1B:
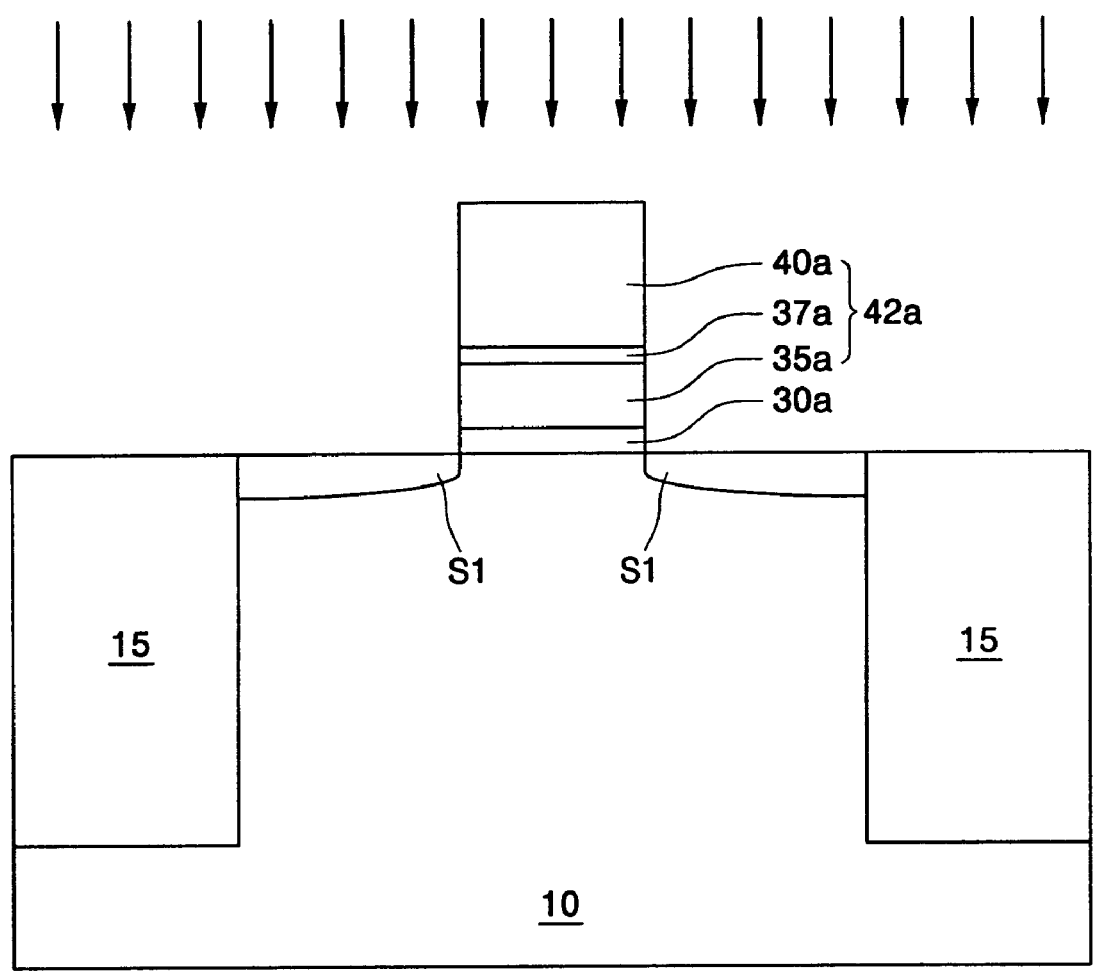
Figure 1C:
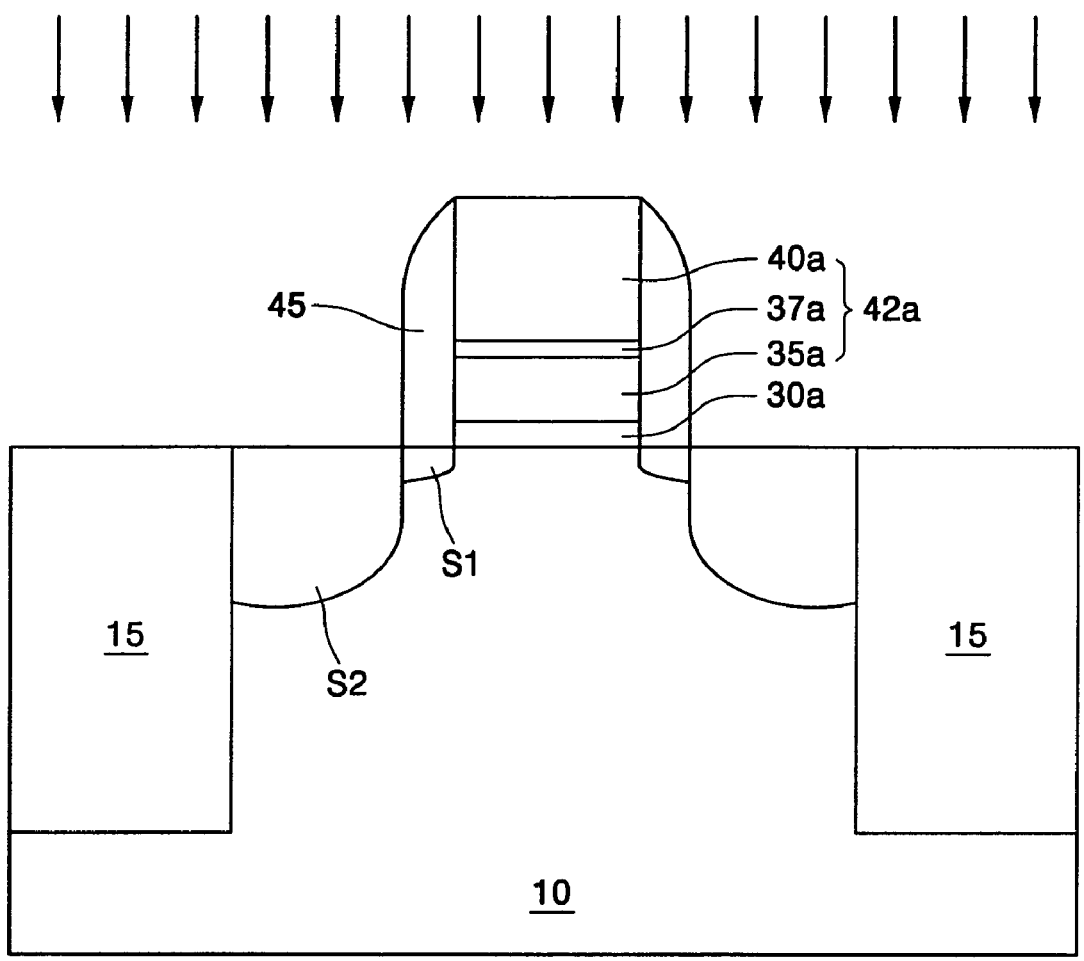

FIGS. 1A to 1C are sectional views illustrating steps of a method of fabricating a MOS transistor, up to formation of source/drain regions, according to embodiments of the present invention.

Referring to FIG. 1A, a device isolation layer 15 is formed in a semiconductor substrate 10 to isolate an active region. The semiconductor substrate 10 may be a single crystal silicon substrate, a silicon on-insulator (SOI) substrate, or a strained silicon substrate. The device isolation layer 15 may be formed using a shallow trench isolation (STI) process. A gate oxide layer 30 is formed on the active region. The gate oxide layer 30 may be formed by a thermal oxidation process. A gate layer 42 is formed on the semiconductor substrate having the gate oxide layer 30. The gate layer 42 includes a lower gate layer 35, an insulating layer 37, and an upper gate layer 40. The gate layer 42 may further include at least one second insulating layer and at least one second upper gate layer, which are formed on the upper gate layer 40. The lower and upper gate layers 35, 40 may be formed of silicon or germanium silicon using an LPCVD, RTCVD, or PECVD method. The insulating layer 37 is preferably formed of a material layer having an etch selectivity with respect to the lower and upper gate layers 35, 40. The insulating layer 37 may be formed of one single layer of silicon oxide, silicon nitride, or silicon oxynitride, or it may be a multi-layer composed of at least two of those materials. Impurity ions are implanted into the gate layer 42 thereby forming a doped gate layer.

Referring to FIG. 1B, the upper gate layer 40, the insulating layer 37, and the lower gate layer 35 are sequentially patterned, thereby forming a gate pattern 42a running over the active region. The gate oxide layer 30 may also be patterned, thereby forming a gate oxide layer pattern 30a. The gate pattern 42a includes a lower gate pattern 35a, an insulating layer pattern 37a and an upper gate pattern 40a.

Using the gate pattern 42a as an ion implantation mask, impurity ions are implanted into the active regions, thereby forming lightly doped drain (LDD) source/drain regions S1.

Referring to FIG. 1C, gate spacers 45 are formed to cover sidewalls of the gate pattern 42a and the gate oxide layer pattern 30a. The gate spacers 45 may be formed of a silicon oxide layer or a silicon nitride layer, or may be formed of a multi-layer composed of at least two layers. Using the gate pattern 42a and the gate spacers 45 as ion implantation masks, impurity ions are implanted into the active region, thereby forming source/drain regions S2.

FIGS. 2A to 2F are sectional views illustrating a method of fabricating a MOS transistor according to a first embodiment of the present invention.

Figure 2A:
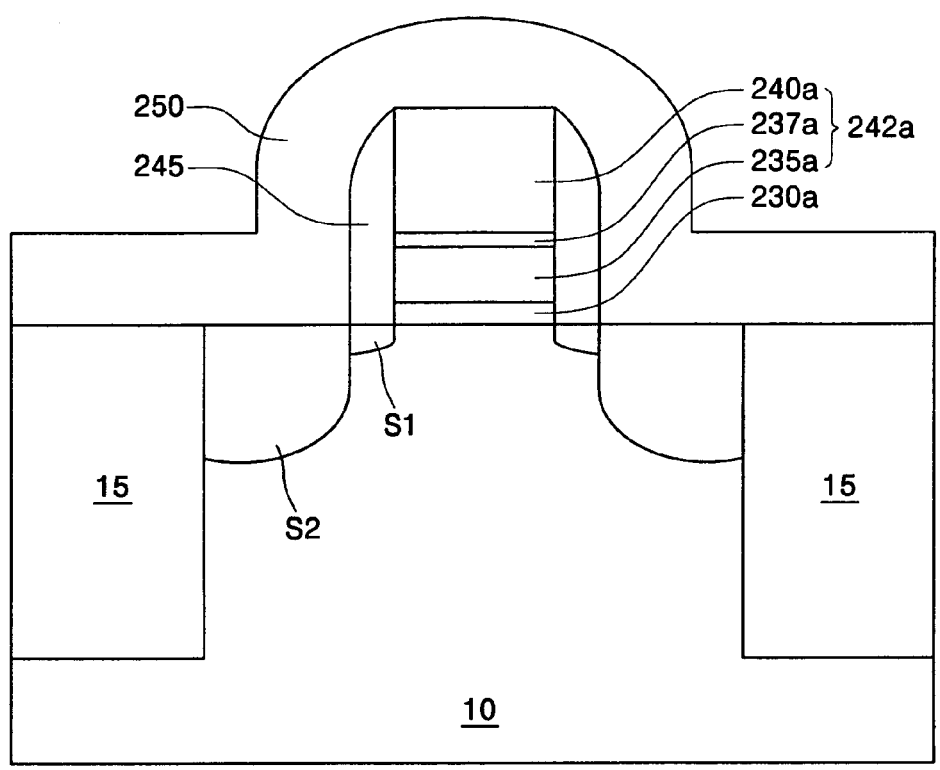
FIGS. 2A to 2F are sectional views illustrating a method of fabricating a MOS transistor according to a first embodiment of the present invention.

Referring to FIG. 2A, as described in reference to FIGS. 1A to 1C, a gate oxide layer pattern 230a and a gate pattern 242a are formed on the semiconductor substrate 10 to run over the active region. The gate pattern 242a includes a lower gate pattern 235a, an insulating layer pattern 237a, and an upper gate pattern 240a. Gate spacers 245 are formed to cover the sidewalls of the gate pattern 242a and the gate oxide layer pattern 230a. A protecting layer 250 is formed on the semiconductor substrate having the gate pattern 242a. The protecting layer 250 functions to protect the surface of the active region during subsequent etch processes or planarization processes. The protecting layer 250 may be formed of a silicon oxide layer, a silicon nitride layer or a silicon oxynitride layer, or a multi-layer composed of at least two of those layers. Further, the protecting layer 250 is preferably formed of a material layer having an etch selectivity with respect to the gate spacers 245. In one embodiment, the protecting layer 250 is formed to have a thickness equal to the sum of the respective thicknesses of the lower gate pattern 235a and the gate oxide layer pattern 230a.

Figure 2B:
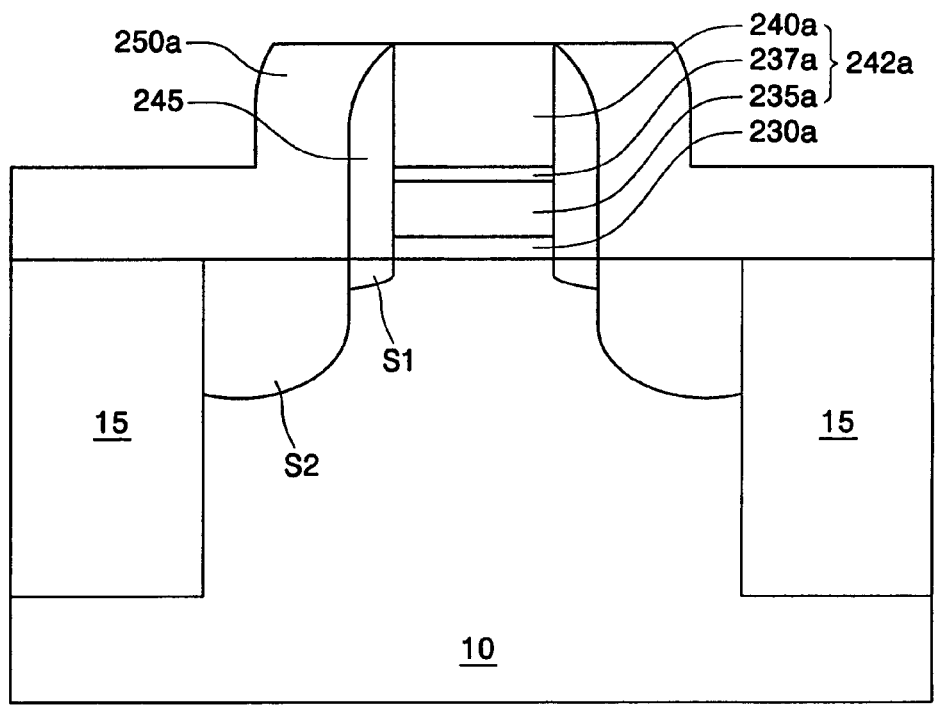

Referring to FIG. 2B, the protecting layer 250 is planarized until the upper gate pattern 240a is exposed, thereby forming a planarized protecting layer 250a. The planarization process may use a chemical mechanical polishing (CMP) process.

Figure 2C:
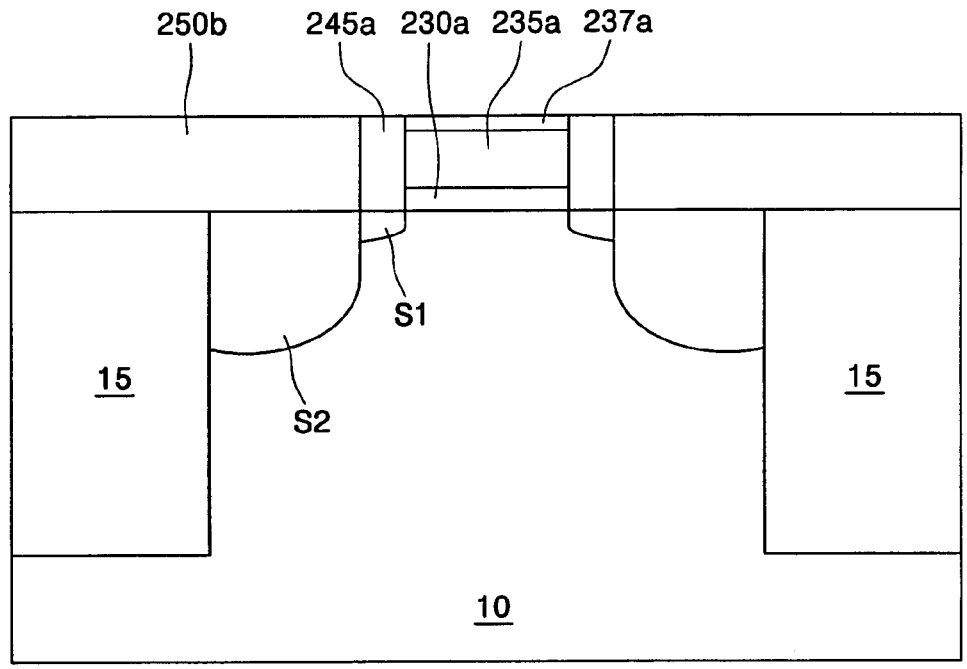

Referring to FIG. 2C, the upper gate pattern 240a is planarized until the insulating layer pattern 237a is exposed. Alternatively, the upper gate pattern 240a may be planarized until the lower gate pattern 235a is exposed. The gate spacers 245 and the protecting layer 250a are concurrently planarized, thereby forming gate spacer patterns 245a and protecting layer patterns 250b. The planarization process may use a CMP process.

Figure 2D:
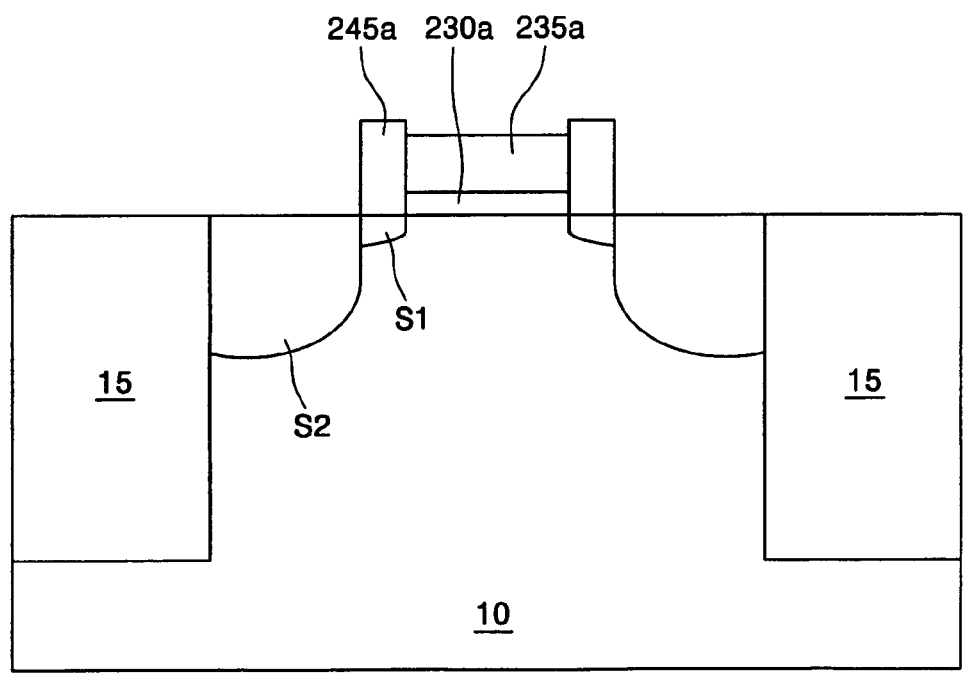

Referring to FIG. 2D, the protecting layer patterns 250b are selectively removed. As a result, the source/drain regions S2 are exposed. Then, the exposed insulating layer pattern 237a is selectively removed, thereby exposing the lower gate pattern 235a.

Figure 2E:
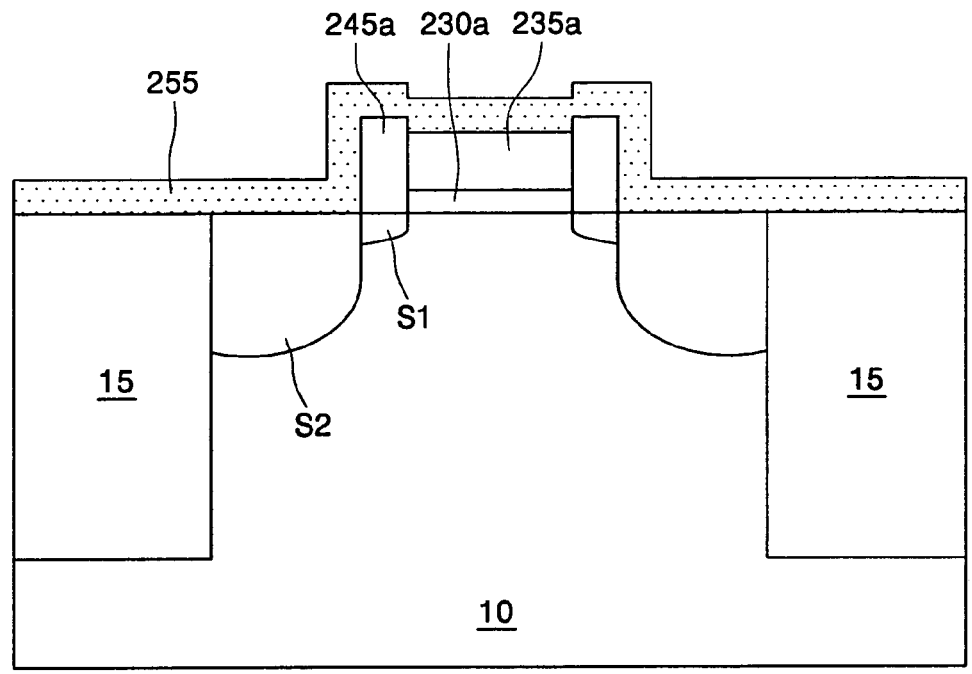

Referring to FIG. 2E, a metal layer 255 is formed on the semiconductor substrate having the exposed lower gate pattern 235a. As a result, the metal layer 255 is formed on the exposed lower gate pattern 235a. Further, the metal layer 255 is formed on the surface of the source/drain regions S2. The metal layer 255 may be composed of nickel, cobalt, tungsten, tantalum, or titanium, or an alloy layer composed of at least two of those metals.

Figure 2F:
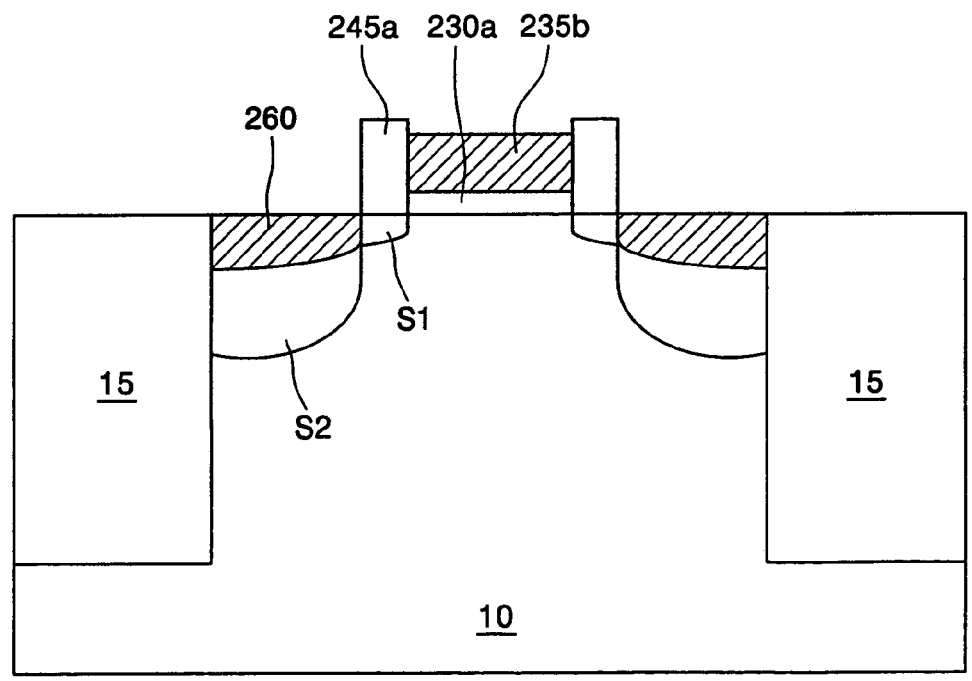

Referring to FIG. 2F, the semiconductor substrate having the metal layer 255 is annealed to react the exposed lower gate pattern 235a and the metal layer 255, thereby forming a fully converted gate silicide layer 235b. A source/drain silicide layer 260 is further formed on the surface of the source/drain region S2. Even though the gate silicide layer 235b and the source/drain silicide layer 260 are concurrently formed, since the lower gate pattern 235a is relatively thin, the junction of the source/drain region S2 is not degraded due to the source/drain silicide layer 260.

After the silicide layers 235b and 260 are formed, an unreacted portion of the metal layer on the gate spacer patterns 245a and the device isolation layer 15 is removed so that the gate suicide layer 235b and the source/drain silicide layer 260 are electrically insulated from each other. At this time, unreacted portions of the metal layer on the suicide layers 235b and 260 are also removed.

Figure 3A:
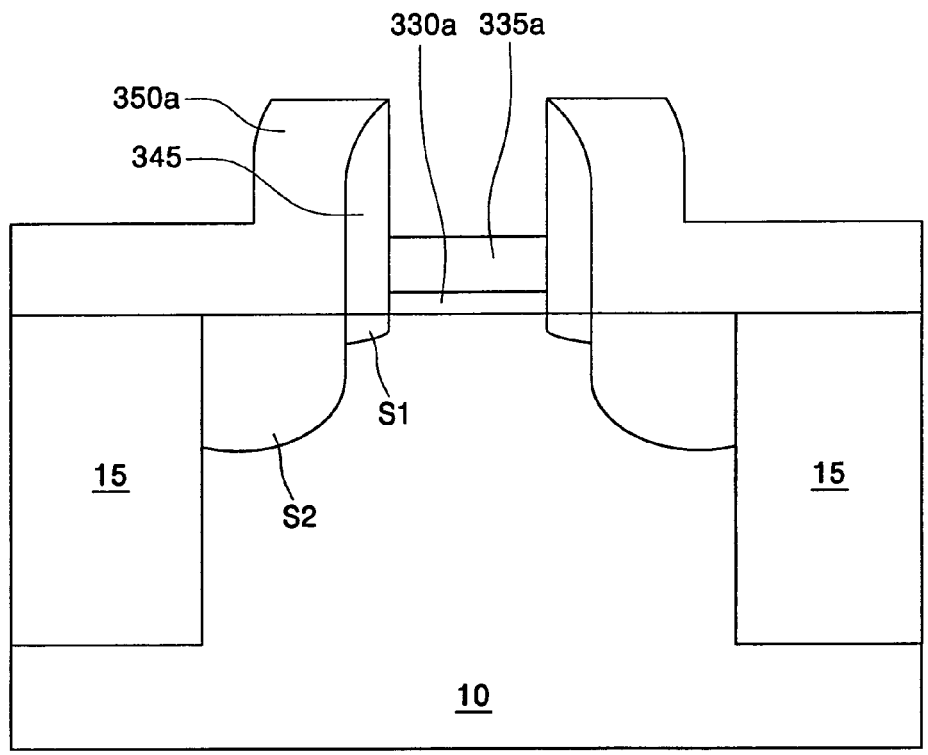
FIGS. 3A to 3C are sectional views illustrating a method of fabricating a MOS transistor according to a second embodiment of the present invention.
Figure 3B:
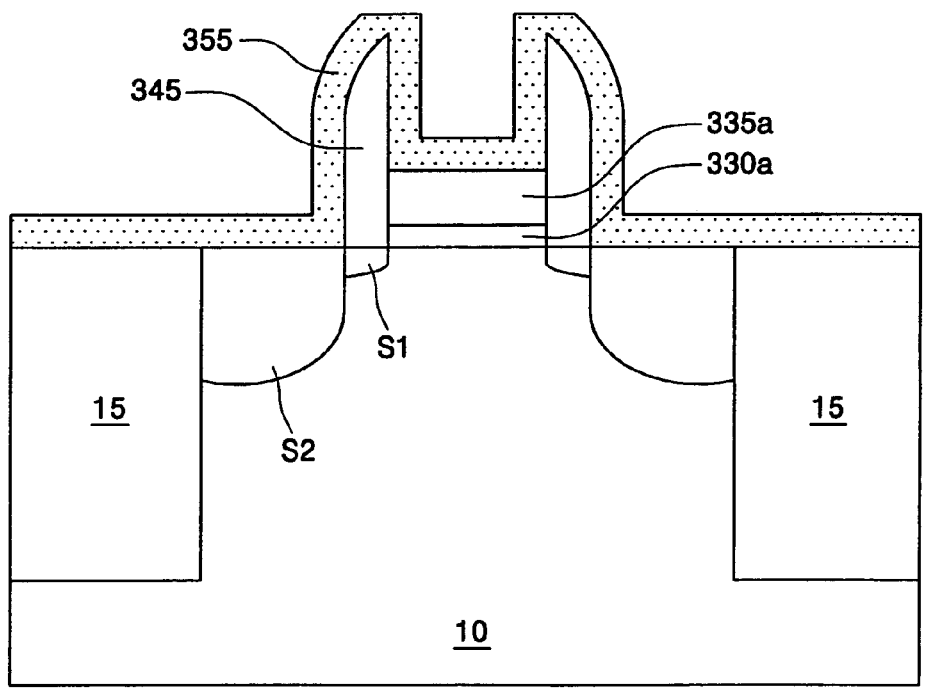
Figure 3C:
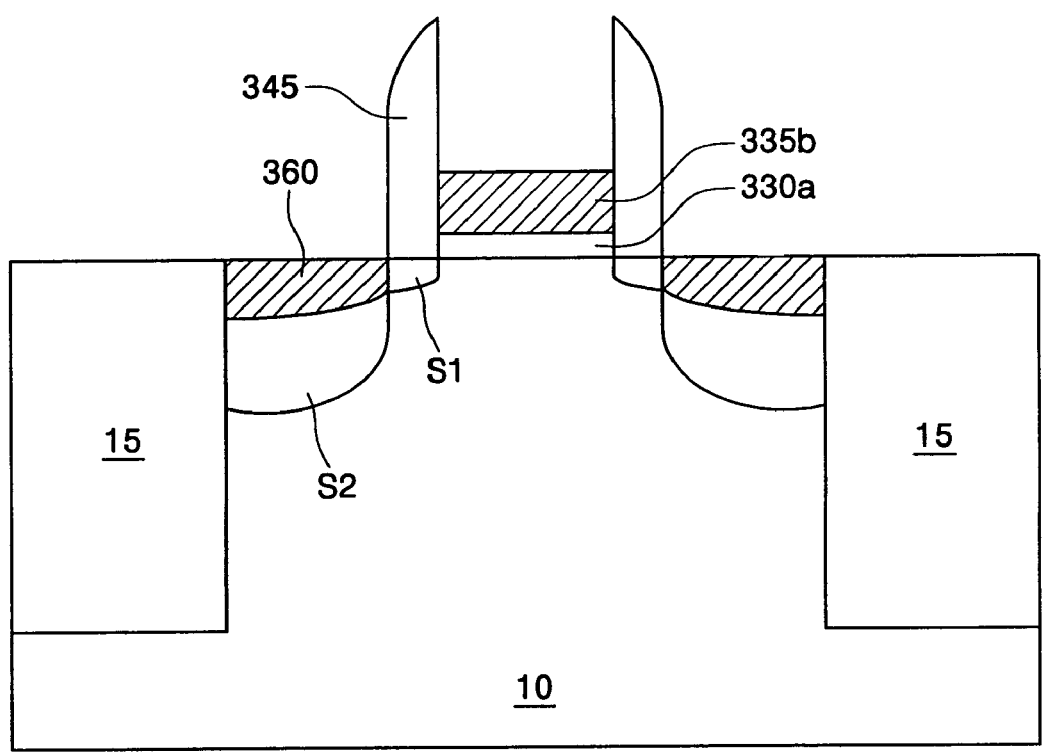

FIGS. 3A to 3C are sectional views illustrating a method of fabricating a MOS transistor according to a second embodiment of the present invention.

Referring to FIG. 3A, as described in reference to FIG. 2B of the first embodiment, a gate oxide layer pattern 330a and a gate pattern 242a are formed on the semiconductor substrate 10 to run over the active region. The gate pattern 242a includes a lower gate pattern 335a, an insulating layer pattern 237a, and an upper gate pattern 240a. Gate spacers 345 are formed to cover the sidewalls of the gate pattern 242a and the gate oxide layer pattern 330a. A planarized protecting layer 350a is formed on the semiconductor substrate having the gate pattern 242a so as to expose the surface of the upper gate pattern 240a. The upper gate pattern 240a is removed using a wet or dry etch technology. Then, the insulating layer pattern 237a is removed using a wet or dry etch technology. As a result, the surface of the lower gate pattern 335a is exposed.

Referring to FIG. 3B, a process is performed to form a metal layer 355 on the semiconductor substrate having the exposed lower gate pattern 335a. As a result, the metal layer 355 is formed on the exposed lower gate pattern 335a. The metal layer 355 is formed on the surface of the source/drain regions S2. The metal layer 355 may be composed of nickel, cobalt, tungsten, tantalum, or titanium, or may be formed of an alloy layer composed of at least two of those metals.

Referring to FIG. 3C, the semiconductor substrate having the metal layer 355 is annealed to react the exposed lower gate pattern 335a and the metal layer 355, thereby forming a fully converted gate silicide layer 335b. A source/drain silicide layer 360 is further formed on the surface of the source/drain region S2. Even though the gate silicide layer 335b and the source/drain silicide layer 360 are concurrently formed, since the lower gate pattern 335a is relatively thin, the junction of the source/drain region S2 is not degraded due to the source/drain silicide layer 360.

After the silicide layers 335b and 360 are formed, an unreacted portion of the metal layer on the gate spacers 345 and the device isolation layer 15 is removed so that the gate silicide layer 335b and the source/drain silicide layer 360 are electrically insulated from each other. At this time, unreacted portions of the metal layer on the silicide layers 335b and 360 are also removed.

FIGS. 4A to 4F are sectional views illustrating a method of fabricating a MOS transistor according to a third embodiment of the present invention.

Figure 4A:
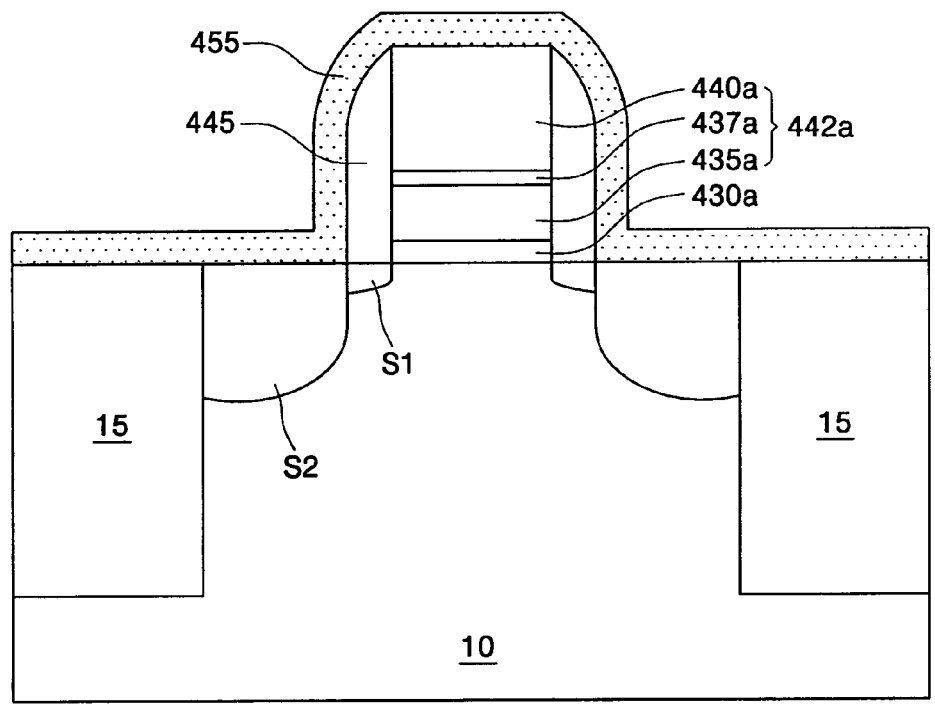
FIGS. 4A to 4F are sectional views illustrating a method of fabricating a MOS transistor according to a third embodiment of the present invention.

Referring to FIG. 4A, as described in reference to FIGS. 1A to 1C, a gate oxide layer pattern 430a and a gate pattern 442a are formed on the semiconductor substrate 10 to run over the active region. The gate pattern 442a includes a lower gate pattern 435a, an insulating layer pattern 437a, and an upper gate pattern 440a. Gate spacers 445 are formed to cover the sidewalls of the gate pattern 442a and the gate oxide layer pattern 430a. A first metal layer 455 is formed on the semiconductor substrate having the gate pattern 442a. As a result, the first metal layer 455 is formed to cover the surfaces of the upper gate pattern 440a and the source/drain regions S2. The first metal layer 455 may be composed of nickel, cobalt, tungsten, tantalum, or titanium, or formed of an alloy layer composed of at least two of these metals.

Figure 4B:
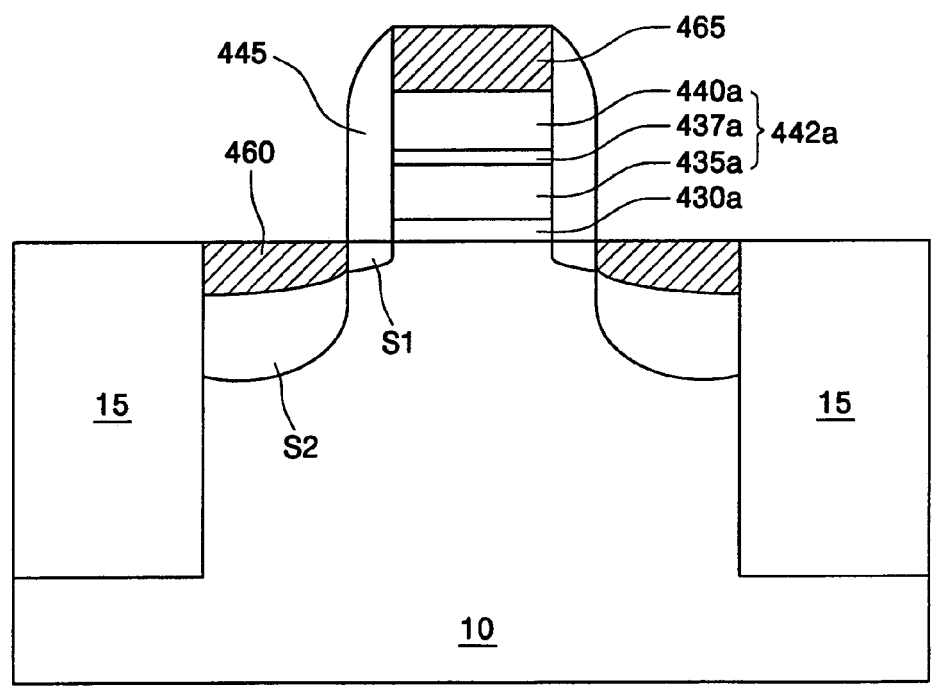

Referring to FIG. 4B, the semiconductor substrate having the first metal layer 455 is annealed, thereby forming an upper gate silicide layer 465 on the upper gate pattern 440a. A source/drain silicide layer 460 is further formed on the surface of the source/drain region S2.

After the silicide layers 465 and 460 are formed, an unreacted portion of the metal layer on the gate spacers 445 and the device isolation layer 15 is removed so that the upper gate silicide layer 465 and the source/drain silicide layer 460 are electrically insulated from each other. At this time, an unreacted portion of the metal layer on the silicide layers 465 and 460 is also removed.

Figure 4C:
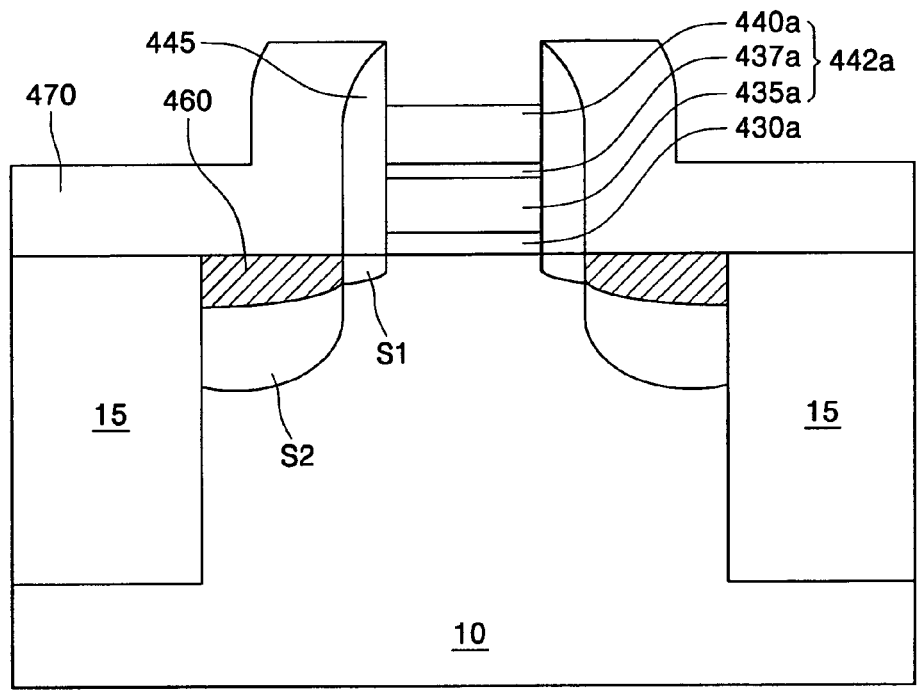

Referring to FIG. 4C, a protecting layer is formed on the semiconductor substrate having the upper gate silicide layer 465. The protecting layer functions to protect the surface of the source/drain silicide layer 460 during subsequent etch processes or planarization processes. The protecting layer may be formed of a silicon oxide layer, a silicon nitride layer or a silicon oxynitride layer, or a multi-layer composed of at least two of these layers. Further, the protecting layer is preferably formed of a material layer having an etch selectivity with respect to the gate spacers 445. The protecting layer is preferably formed to have a thickness equal to the sum of the respective thicknesses of the lower gate pattern 435a and the gate oxide layer pattern 430a. The protecting layer is planarized until the upper gate silicide layer 465 is exposed, thereby forming a planarized protecting layer 470. The exposed upper gate silicide layer 465 is removed using a wet or dry etch technology.

Figure 4D:
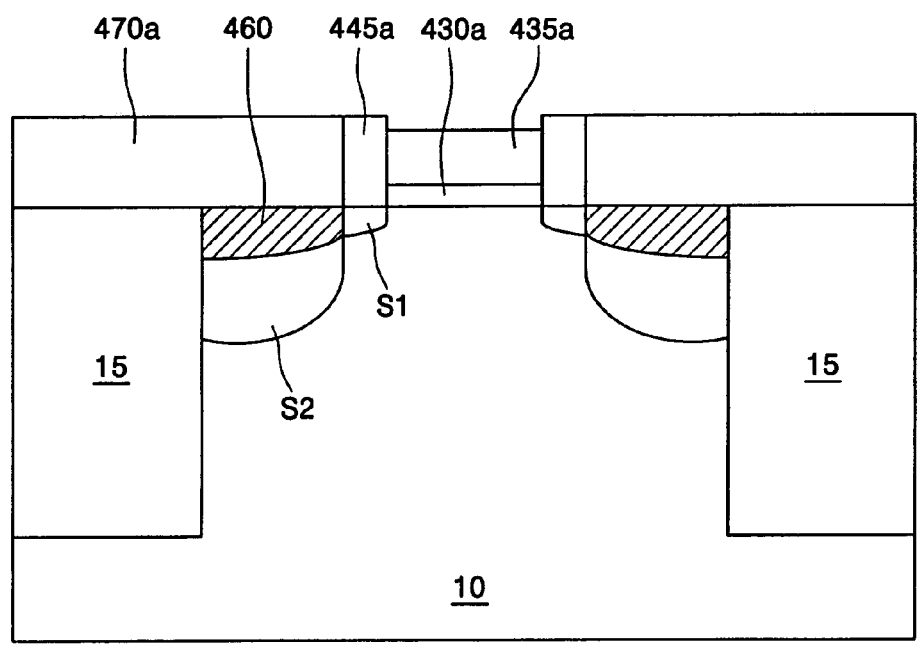

Referring to FIG. 4D, the upper gate pattern 440a is planarized until the insulating layer pattern 437a is exposed. Alternatively, the upper gate pattern 440a may be planarized until the lower gate pattern 435a is exposed. The gate spacers 445 and the protecting layer 470 are concurrently planarized, thereby forming gate spacer patterns 445a and protecting layer patterns 470a. The planarization process may use a CMP process. Then, the exposed insulating layer pattern 437a is removed, thereby exposing the lower gate pattern 435a.

Figure 4E:
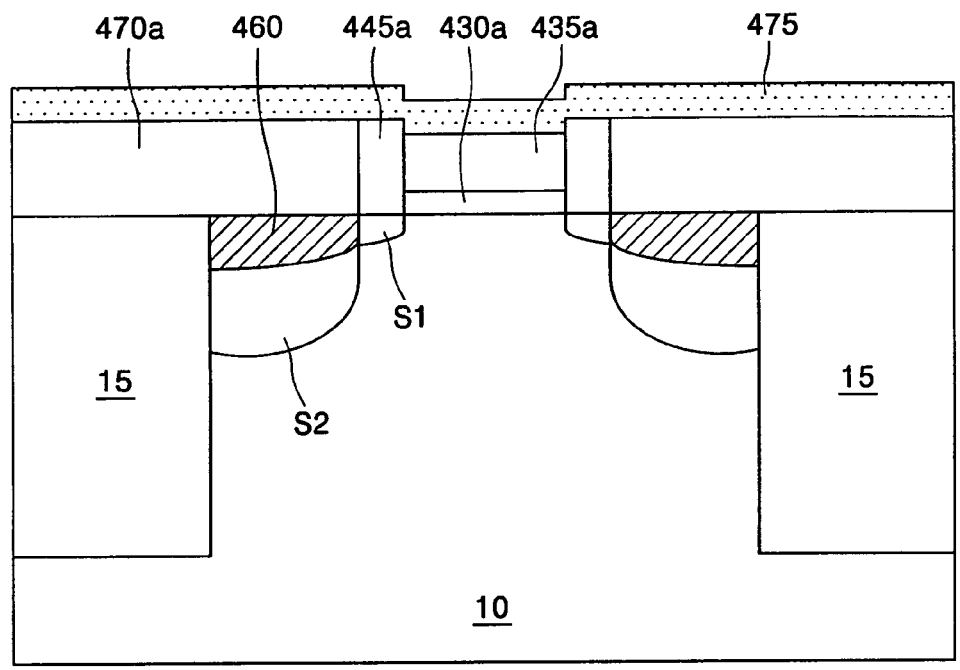

Referring to FIG. 4E, a second metal layer 475 is formed on the semiconductor substrate having the exposed lower gate pattern 435a. As a result, the second metal layer 475 is formed on the exposed lower gate pattern 435a. The second metal layer 475 may be composed of nickel, cobalt, tungsten, tantalum, or titanium, or an alloy layer composed of at least two of those metals.

Figure 4F:
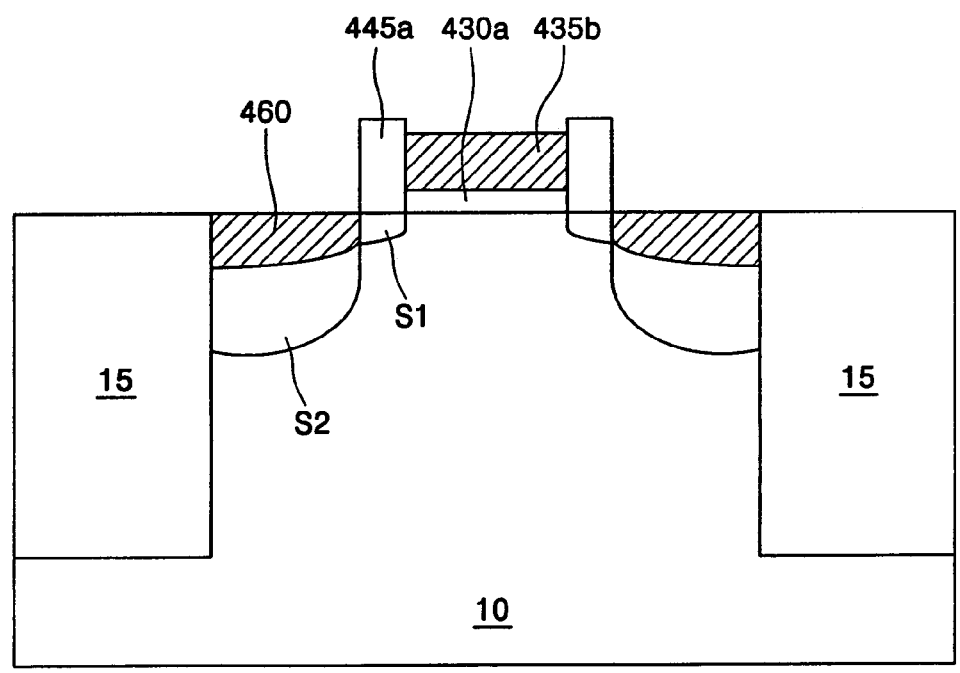

Referring to FIG. 4F, the semiconductor substrate having the second metal layer 475 is annealed to react the exposed lower gate pattern 435a and the second metal layer 475, thereby forming a fully converted gate silicide layer 435b. After the gate silicide layer 435b is formed, an unreacted portion of the metal layer on the gate spacer patterns 445a and the protecting layer patterns 470a is removed. At this time, an unreacted portion of the metal layer on the gate silicide layer 435b is also removed. Then, the protecting layer patterns 470a are removed.

Figure 5A:
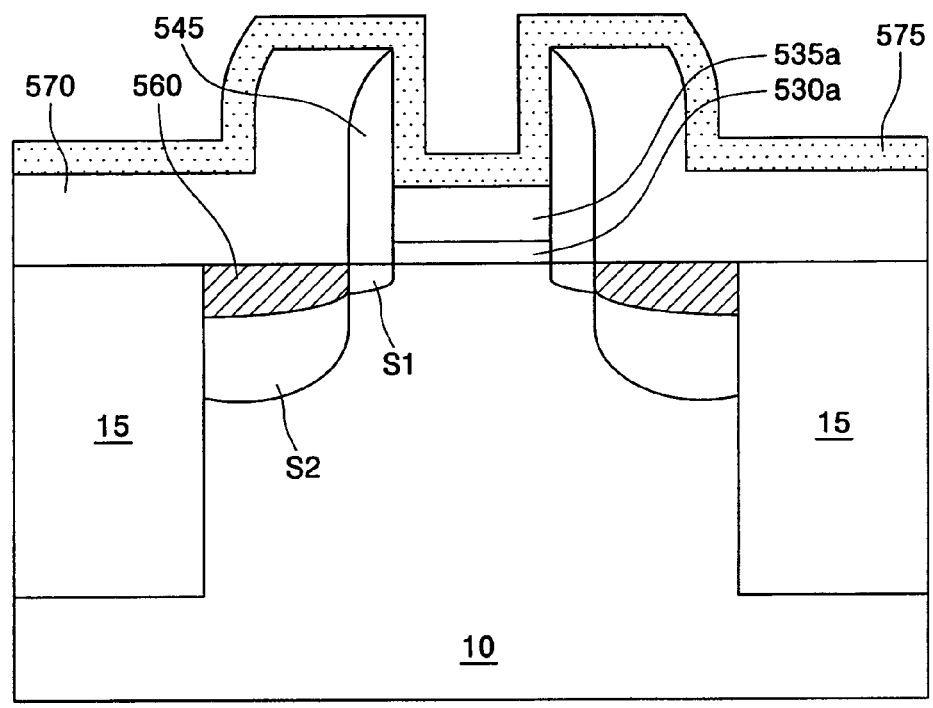
FIGS. 5A and 5B are sectional views illustrating a method of fabricating a MOS transistor according to a fourth embodiment of the present invention.
Figure 5B:
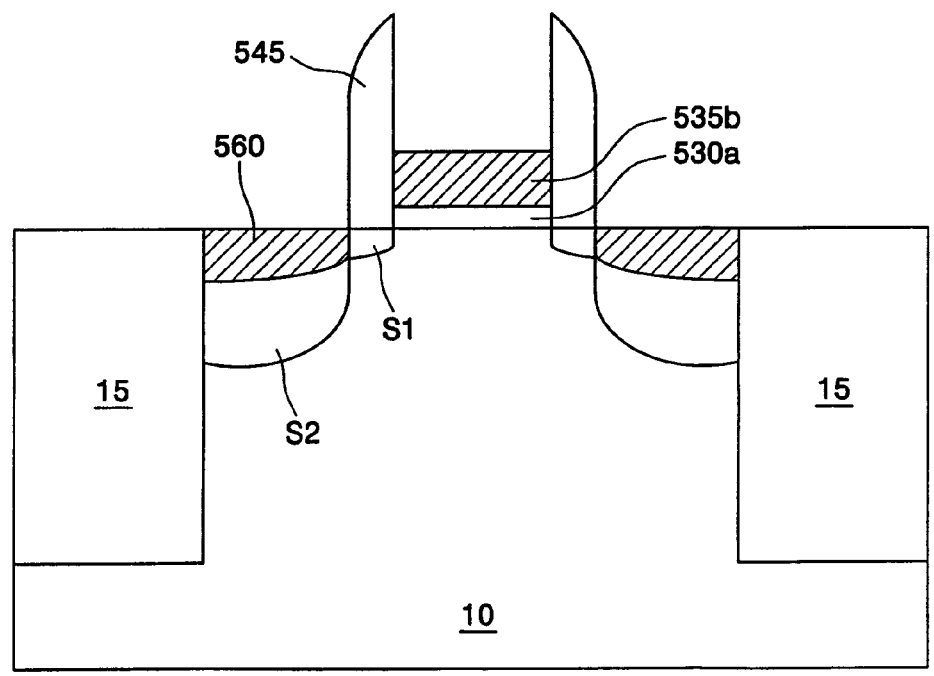

FIGS. 5A and 5B are sectional views illustrating a method of fabricating a MOS transistor according to a fourth embodiment of the present invention.

Referring to FIG. 5A, as described in reference to FIG. 4C of a third embodiment of the present invention, a gate oxide layer pattern 530a and a gate pattern 442a are formed on the semiconductor substrate 10 to run over the active region. The gate pattern 442a includes a lower gate pattern 535a, an insulating layer pattern 437a, and an upper gate pattern 440a. Gate spacers 545 are formed to cover the sidewalls of the gate pattern 442a and the gate oxide layer pattern 530a. A planarized protecting layer 570 is formed on the semiconductor substrate until the gate spacers 545 are exposed. The upper gate pattern 440a is removed using a wet or dry etch technology. Then, the insulating layer pattern 437a is removed using a wet or dry etch technology. As a result, the surface of the lower gate pattern 535a is exposed.

A second metal layer 575 is formed on the semiconductor substrate having the exposed lower gate pattern 535a. As a result, the second metal layer 575 is formed on the exposed lower gate pattern 535a. Further, the second metal layer 575 may be composed of nickel, cobalt, tungsten, tantalum, or titanium, or an alloy layer composed of at least two of those metals.

Referring to FIG. 5B, the semiconductor substrate having the second metal layer 575 is annealed to react the lower gate pattern 535a and the second metal layer 575, thereby forming a fully converted gate silicide layer 535b. After the gate silicide layer 535b is formed, an unreacted portion of the metal layer on the gate spacers 545 and the planarized protecting layer 570 is removed. At this time, an unreacted portion of the metal layer on the gate silicide layer 535b is also removed. Then, the planarized protecting layer 570 is removed using a wet etch technology.

According to the present invention as described above, a method of fabricating a MOS transistor is provided to prevent impurity ions from being injected into a channel during the ion implantation into source/drain regions, in which a silicide layer of the source/drain regions and a gate silicide layer are concurrently formed or formed by two steps, using a fully silicided gate process. Therefore, a short channel effect and polysilicon depletion can be reduced. As a result, the method of the present invention provides a MOS transistor with a high integration and a good device performance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a MOS transistor comprising:
   forming a gate pattern and gate spacers on a semiconductor substrate, the gate pattern including a lower gate pattern, an insulating layer pattern, and an upper gate pattern, which are sequentially stacked;
   forming source/drain regions by implanting impurity ions into an active region using the gate pattern and the gate spacers as ion implantation masks;
   forming a protecting layer on the semiconductor substrate having the gate pattern;
   planarizing the protecting layer, the gate pattern, and the gate spacers until the insulating layer pattern is exposed, wherein the planarized protecting layer, the planarized gate pattern, and the planarized gate spacers are at substantially the same height relative to the substrate;
   removing the insulating layer pattern, thereby exposing the lower gate pattern;
   selectively removing the protecting layer, thereby exposing the source/drain regions; and
   fully converting the exposed lower gate pattern to a gate silicide layer and concurrently forming a silicide layer on the surfaces of the source/drain regions.

2. The method according to claim 1, wherein the step of forming the gate pattern and the gate spacers comprises:
   forming a device isolation layer in a predetermined area of the semiconductor substrate so as to isolate the active region;
   forming a gate layer on the semiconductor substrate, the gate layer including a lower gate layer, an insulating layer, and an upper gate layer, which are sequentially stacked;
   sequentially patterning the upper gate layer, the insulating layer, and the lower gate layer, thereby forming a pattern running over the active region; and
   forming spacers on sidewalls of the gate pattern.

3. The method according to claim 2, further comprising, before forming the gate pattern, a step of forming a doped gate layer by implanting impurity ions into the gate layer.

4. The method according to claim 1, wherein the step of removing the insulating layer pattern comprises:
   etching the insulating layer pattern using a wet or dry etch technology.

5. The method according to claim 1, wherein the step of fully converting the exposed lower gate pattern to a gate silicide layer and concurrently forming a silicide layer on the surfaces of the source/drain regions comprises:
   forming a metal layer on the semiconductor substrate having the exposed lower gate pattern;
   annealing the metal layer until the exposed lower gate pattern is totally silicided; and
   removing an unreacted portion of the metal layer on the gate spacers and the device isolation layer.

6. The method according to claim 5, wherein the metal layer is composed of one metal selected from the group consisting of nickel, cobalt, tungsten, tantalum, and titanium, and an alloy layer composed of at least two of nickel, cobalt, tungsten, tantalum, and titanium.

7. The method according to claim 1, wherein the semiconductor substrate is one of a single crystal silicon substrate, a silicon-on insulator (SOI) substrate, and a strained silicon substrate.

8. The method according to claim 1, wherein the upper and lower gate patterns are formed of at least one of silicon and germanium silicon using at least one of an LPCVD, RTCVD, and PECVD technology.

9. The method according to claim 1, wherein the insulating layer pattern is formed of one of a single layer selected from the group consisting of a silicon oxide layer, a silicon nitride layer, and a silicon oxynitride layer, and a multi-layer composed of at least two of a silicon oxide layer, a silicon nitride layer, and a silicon oxynitride layer.

10. The method according to claim 1, wherein the protecting layer is formed of one of a single layer selected from the group consisting of a silicon oxide layer, a silicon nitride layer, and a silicon oxynitride layer, and a multi-layer composed of at least two of a silicon oxide layer, a silicon nitride layer, and a silicon oxynitride layer.

11. The method according to claim 1, further comprising forming at least one second insulating layer pattern and at least one second upper gate pattern on the upper gate pattern.

12. The method according to claim 1, wherein the gate spacers are formed of one of a single-layered wall selected from the group consisting of a silicon oxide layer and a silicon nitride layer and a multi-layered wall composed of at least two of a silicon oxide layer and a silicon nitride layer.

13. The method according to claim 1, wherein the protecting layer is formed of a material layer having an etch selectivity with respect to the gate spacers.

14. A method of fabricating a MOS transistor comprising:
   forming a gate pattern and gate spacers on a semiconductor substrate, the gate pattern including a lower gate pattern, an insulating layer pattern, and an upper gate pattern, which are sequentially stacked;
   forming source/drain regions by implanting impurity ions into an active region using the gate pattern and the gate spacers as ion implantation masks;
   forming a silicide layer on a surface of the upper gate pattern and surfaces of the source/drain regions, thereby forming an upper gate suicide layer and a source/drain silicide layer;
   forming a protecting layer on the semiconductor substrate having the upper gate silicide layer;
   planarizing the protecting layer until a surface of the upper gate silicide layer is exposed;
   removing the upper gate silicide layer;
   planarizing the upper gate pattern, the protecting layer, and the gate spacers until the insulating layer pattern is exposed, and removing the insulating layer pattern, thereby exposing the lower gate pattern, wherein the planarized protecting layer and the planarized gate spacers are at substantially the same height relative to the substrate; and
   fully converting the exposed lower gate pattern to a silicide layer.

15. The method according to claim 14, wherein the step of forming the gate pattern and the gate spacers comprises:
   forming a device isolation layer in a predetermined area of the semiconductor substrate so as to isolate the active region;

forming a gate layer on the semiconductor substrate, the gate layer including a lower gate layer, an insulating layer, and an upper gate layer, which are sequentially stacked;

sequentially patterning the upper gate layer, the insulating layer, and the lower gate layer, thereby forming a pattern running over the active region; and forming spacers on sidewalls of the gate pattern.

16. The method according to claim 15, further comprising, before forming the gate pattern, a step of forming a doped gate layer by implanting impurity ions into the gate layer.

17. The method according to claim 14, wherein the step of removing the insulating layer pattern comprises:

etching the insulating layer pattern using one of a wet and a dry etch technology.

18. The method according to claim 14, wherein the protecting layer is formed of a material layer having an etch selectivity with respect to the gate spacers.

19. A method of fabricating a MOS transistor comprising:

forming a gate pattern and gate spacers on a semiconductor substrate, the gate pattern including a lower gate pattern, a first insulating layer pattern, and a first upper gate pattern, which are sequentially stacked;

forming at least one second insulating layer pattern and at least one second upper gate pattern on the first upper gate pattern;

forming source/drain regions by implanting impurity ions into an active region using the gate pattern and the gate spacers as ion implantation masks;

forming a protecting layer on the semiconductor substrate having the gate pattern;

planarizing the protecting layer until the upper gate pattern is exposed;

removing the upper gate pattern and the insulating layer pattern, thereby exposing the lower gate pattern;

selectively removing the protecting layer, thereby exposing the source/drain regions; and fully converting the exposed lower gate pattern to a gate silicide layer and concurrently forming a silicide layer on the surfaces of the source/drain regions.

* * * * *

UNITED STATES PATENT AND TRADEMARK OFFICE
CERTIFICATE OF CORRECTION

PATENT NO. : 7,179,714 B2 Page 1 of 1
APPLICATION NO. : 11/065242
DATED : February 20, 2007
INVENTOR(S) : You-Jean Chang et al.

It is certified that error appears in the above-identified patent and that said Letters Patent is hereby corrected as shown below:

Column 9, line 52, delete ":" after "comprises"

Column 10, line 46, delete "suicide" and insert --silicide--

Column 11, line 14, delete ":" after "comprises"

Signed and Sealed this

Seventeenth Day of July, 2007

JON W. DUDAS
*Director of the United States Patent and Trademark Office*